United States Patent
Lam et al.

(10) Patent No.: US 7,476,926 B2
(45) Date of Patent: Jan. 13, 2009

(54) ERASEABLE NONVOLATILE MEMORY WITH SIDEWALL STORAGE

(75) Inventors: Chung H. Lam, Peekskill, NY (US); Jeffrey B. Johnson, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/905,475

(22) Filed: Jan. 6, 2005

(65) Prior Publication Data

US 2006/0145235 A1    Jul. 6, 2006

(51) Int. Cl.
*H01L 29/76* (2006.01)
(52) U.S. Cl. ................................ 257/314; 257/316
(58) Field of Classification Search .......... 257/314
See application file for complete search history.

(56) References Cited

U.S. PATENT DOCUMENTS

| | | | |
|---|---|---|---|
| 4,545,035 A | 10/1985 | Guterman et al. | |
| 5,768,192 A | 6/1998 | Eitan | |
| 6,225,162 B1 | 5/2001 | Lin et al. | |
| 6,352,895 B1 | 3/2002 | Lam | |
| 6,518,614 B1 | 2/2003 | Breitwisch et al. | |
| 6,624,029 B2 | 9/2003 | Lojek et al. | |
| 2002/0040992 A1 | 4/2002 | Manabe et al. | |
| 2002/0153666 A1 | 10/2002 | Manabe et al. | |
| 2003/0067032 A1 | 4/2003 | Caprara et al. | |
| 2003/0141540 A1 | 7/2003 | Kusumi et al. | |
| 2003/0235952 A1* | 12/2003 | Shibata | 438/257 |
| 2005/0121715 A1* | 6/2005 | Jeng | 257/314 |

\* cited by examiner

*Primary Examiner*—Jack Chen
(74) *Attorney, Agent, or Firm*—Law Office of Charles W. Peterson, Jr.; Anthony Canale

(57) ABSTRACT

A nonvolatile storage cell and an integrated circuit (IC) including the cells. A layered spacer (ONO) is formed at least at one sidewall of cell gates. Source/drain diffusions at each layered spacer underlap the adjacent gate. Charge may be stored at a layer (an imbedded nitride layer) in the layered spacer.

16 Claims, 4 Drawing Sheets

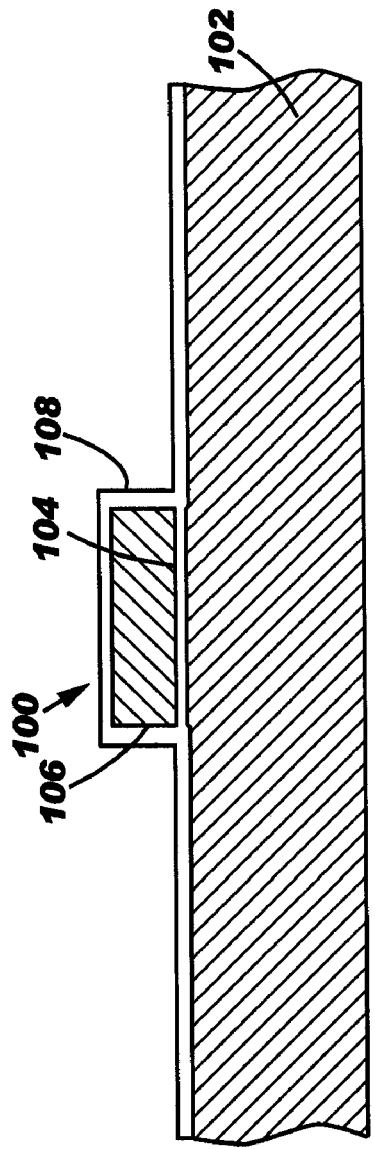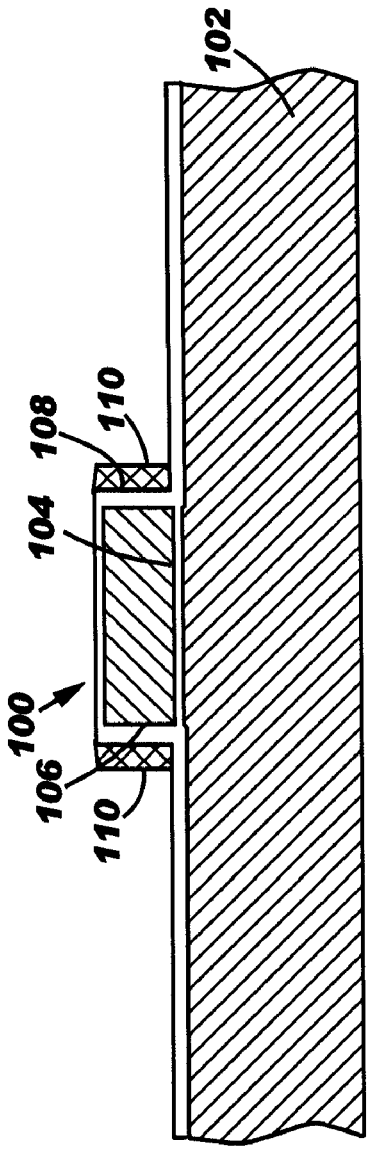

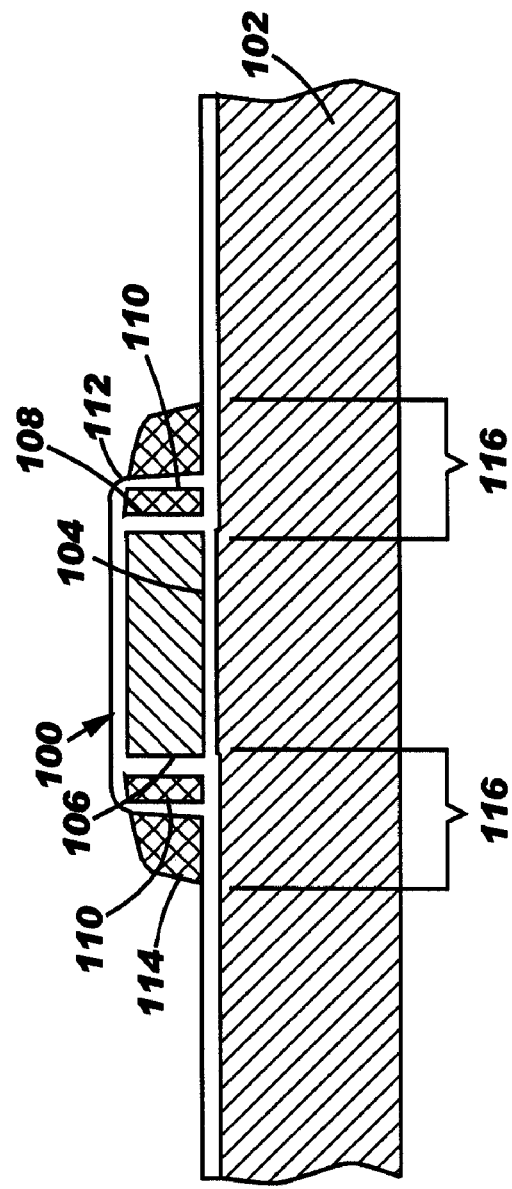
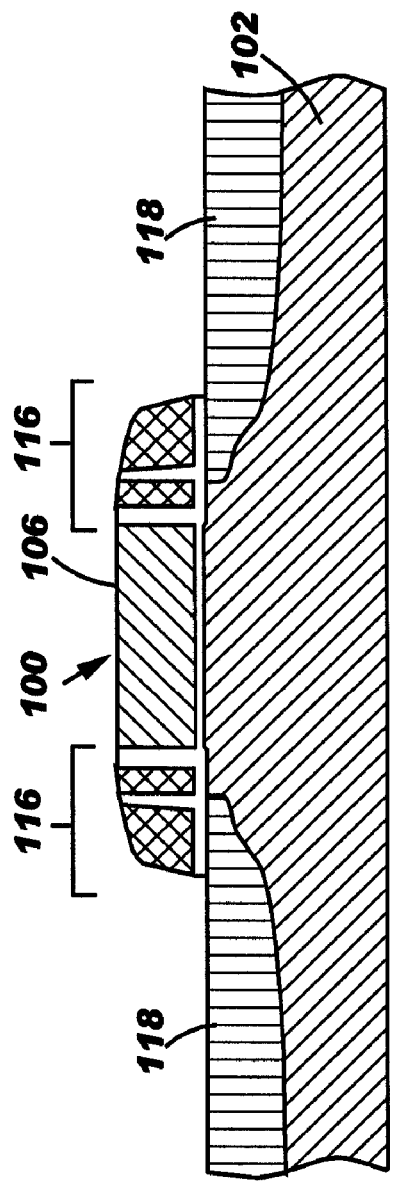

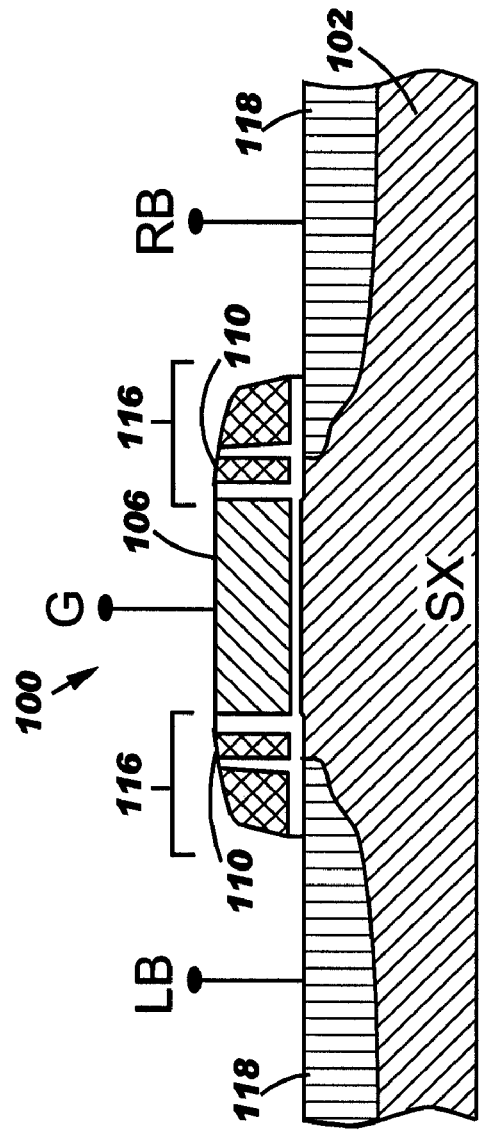

US 7,476,926 B2

ERASEABLE NONVOLATILE MEMORY WITH SIDEWALL STORAGE

FIELD OF THE INVENTION

The present invention is related to nonvolatile storage and more particularly to integrated circuit chips including nonvolatile storage such as one or more cells or an array of nonvolatile random access memory (NVRAM) cells.

BACKGROUND DESCRIPTION

Nonvolatile floating gate storage devices, such as may be used for memory cells in a nonvolatile random access memory (NVRAM), are well known in the industry. In a typical such NVRAM cell, the cell's conductive state is determined by charge or lack thereof on the storage device's floating gate. The floating gate is an electrically isolated gate of a field effect transistor (FET) stacked in a two device NAND-like structure with the gate of a select device. Charge is forced onto or removed from the floating gate through a thin insulator layer that, during a normal read, isolates the gate electrically from other adjoining conductive layers. For example, a negatively (or positively) charged floating gate may be representative of a binary one state, while an uncharged floating gate may be representative of a binary zero state or, vice versa.

Typically, the select device in the NAND-like structure is connected to a word line. In typical state of the art designs, adjacent cells are connected to a common bit line. Each of the word lines is uniquely addressable and physically distinct. Intersection of each word line with each bit line provides unique cell selection for reading and writing the selected cell. For reading, a read voltage (e.g., $V_{hi}$ or ground) is applied to a control gate (or program gate) that is capacitively coupled to floating gates of the nonvolatile devices of devices being read. Typically, the bit lines are pre-charged high. Thus, when a word line is raised, bit lines discharge for those devices programmed for zeros and do not those programmed for ones. For writing, a write voltage applied to the control gate (or program gate) is capacitively coupled to floating gates of the nonvolatile devices and, when the gate, source and drain voltages are biased properly, the charge changes on the floating gate, i.e., to write selected cells. Similarly, cells are biased to remove the charge from the floating gates during each erase.

The typically high voltages needed to write and erase each cell normally require a very complicated fabrication process. So, to minimize cell write voltages and for adequate read performance, the floating gate is large. Consequently, large floating gates account for much of the cell area for a typical NVRAM cell. While, reduced cell size cannot come at the expense of unacceptably degraded performance, designers normally strive for minimum cell size to achieve maximum cell density for reduced storage costs.

Thus, there is a need for smaller, denser NVRAM cells.

SUMMARY OF THE INVENTION

It is a purpose of the invention to improve nonvolatile storage density;

It is another purpose of the invention to increase eraseable nonvolatile storage cell density;

It is yet another purpose of the invention to double the density of nonvolatile storage arrays.

The present invention relates to a nonvolatile storage cell and an integrated circuit (IC) including the cells. A layered spacer (oxide-nitride-oxide) is formed at least at one sidewall of cell gates. A metallurgical junction of subsequently formed source/drain diffusion regions at each layered spacer lies under the layer spacer rather than under the polysilicon gate of cell. This alignment of the metallurgical junction under the layered spacer is referred to herein as underlap. Charge may be stored at a layer (an imbedded nitride layer) in the layered spacer.

BRIEF DESCRIPTION OF THE DRAWINGS

The foregoing and other objects, aspects and advantages will be better understood from the following detailed description of a preferred embodiment of the invention with reference to the drawings, in which:

FIGS. 1A-E show an example of forming preferred embodiment nonvolatile storage cells, e.g., erasable nonvolatile random access memory (NVRAM) cells in a NVRAM array or distributed at strategic locations in chip logic;

FIGS. 2A-B show application of programming voltages to a cell formed as in the example of FIGS. 1A-E.

DESCRIPTION OF PREFERRED EMBODIMENTS

Figure 1C:
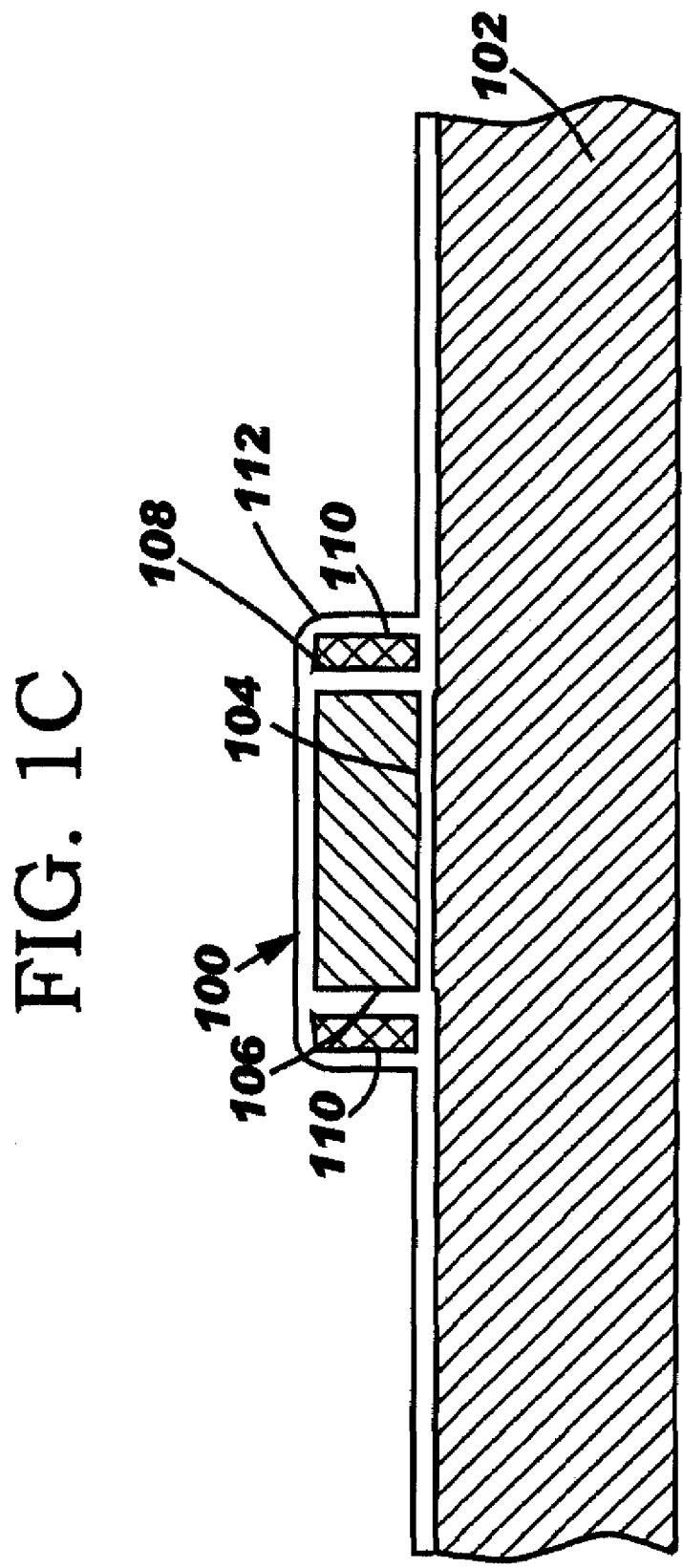

Turning now to the drawings and, more particularly, FIGS. 1A-E show an example of forming preferred embodiment erasable underlapped devices for nonvolatile storage cells 100, e.g., erasable NonVolatile Random Access Memory (NVRAM) cells in a NVRAM array or distributed at strategic locations in chip logic. Each preferred embodiment erasable cell 100 includes a Field Effect Transistor (FET) with spacers along the sidewalls of the gate, i.e., at the FET source and drain, spacing the FET source and drain from the channel such that the source/drain diffusion underlaps the gate at each sidewall. Preferred embodiment cells store charge substantially similar to the write once cell described in U.S. Pat. No. 6,518,614 B1 to Breitwisch et al., entitled "Embedded On-Time Programmable Non-Volatile Memory Using Prompt Shift Device," assigned to the assignee of the present invention and incorporated herein by reference. The FET may be an N-type FET (NFET) or P-type FET (PFET) in a typical insulated-gate technology such as what is typically referred to as CMOS. In particular, the preferred spacer media is an Oxide-Nitride-Oxide (ONO) sidewall structure formed at each gate of each cell FET that only incrementally increases the FET size. Moreover, the programmed storage characteristic is not bidirectionally symmetrical and so, two bits may be stored at and read from each FET by biasing the cell FET appropriately during reads and writes. Thus, preferred embodiment storage cells may be provided in a double dense array; in small groups of cells; or, when provided appropriate read/write logic, individual cells may be used in combination with or distributed throughout random logic. For example, cells may be included in logic macros for a rudimentary, electrically-alterable Engineering Change (EC) capability for a logic chip, or as RAM chip select logic.

So, cell formation begins in FIG. 1A by defining device locations at each cell 100 on a suitable semiconductor layer 102. So, for an NFET cell for example, cell formation begins by forming gates (e.g., N-type polysilicon) on a p-type bulk silicon wafer or a p-type silicon surface layer on a Silicon On Insulator (SOI) wafer. First, a gate dielectric layer 104, e.g., 10-55 Å of oxide, is formed on the surface of the semiconductor layer 102. Gates 106 are formed by forming a gate layer, preferably 150 nm thick, on the gate dielectric layer 104 and patterning the gate layer, e.g., photolithographically. Preferably, when the gate layer is patterned, e.g., etched, etching continues to and slightly into the underlying semiconductor layer 102, which removes portions of the gate dielectric layer 104 not under a gate 106. Once the gates 106 are defined to define the cell/device locations 100, a first sidewall spacer layer 108 of an isolating material is conformally formed on the surface. Preferably, the first sidewall spacer material layer 108 is a 3-10 nm thick layer of oxide grown on the surface of the silicon layer 102 and most preferably, a 6 nm thick layer. The first sidewall spacer layer, oxide layer 108, is followed by a halo implant (not shown). Then, the cell locations 100 are blocked off and an extension implant forms source/drain extensions at non-cell FETs substantially as described in Breitwisch et al. Alternately, the halo implant may be done after blocking the extension implant.

Next, as shown in FIG. 1B, charge storage spacers 110 are formed along either side of the gate 106. First, a conformal layer of a second spacer material is formed over the first sidewall spacer layer 108. Preferably, the second spacer material layer is a 5-15 nm thick layer of nitride deposited on the first sidewall spacer layer 108 and most preferably, a 10 nm thick layer. Then, the conformal nitride layer is etched to define charge storage spacers 110 along the sidewalls, e.g., using a Reactive Ion Etch (RIE) to remove horizontal portions of the conformal nitride layer.

FIG. 1C shows formation of a second, thinner (in this example) isolating layer 112 on the surface, e.g., of the first sidewall spacer material layer. Preferably, the thin isolating layer 112 is a 3-10 nm thick layer of oxide and most preferably, a 3 nm thick oxide layer formed on the surface in a high temperature (e.g., 800-900° C.) deposition. Then, a thicker conformal layer of the second spacer material is formed over the thin isolating layer 112. Preferably, the thicker second sidewall spacer material layer is a 10-90 nm thick layer of nitride deposited on the thin isolating layer 112 and most preferably, 70 nm thick. Outboard nitride sidewall spacers 114 in FIG. 1D are defined, e.g., using a RIE to etch the thicker nitride layer. Thus, layered spacers 116 have been formed in each cell 100 at each end of the gates 102.

Finally, in FIG. 1E, source/drain regions 118 are formed at either end of the gate 106. Because the source/drain extension implant was blocked out, the shallow N+ implant does not exist under the cell sidewalls 116 and so, cell source/drain regions 118 are underlapped, i.e., spaced away from the gates 106. Once source/drain regions 118 are formed, the remaining horizontally formed oxide from isolating layers 108 and 112 is removed, e.g., using a typical oxide clean, so that FET terminals (gate 106 and source/drain regions 118) may be silicided normally. Thereafter, processing proceeds normally through typical back end processing steps to form circuit, intercircuit and off chip wiring.

FIGS. 2A-B show application of programming voltages to a cell formed as in the example of FIGS. 1A-E. Thus, in this example, the back or substrate bias to the silicon channel layer 102 is labeled SX; the bias to the gate 106 is labeled G; and the baises for source/drain regions 118 are differentiated LB for left bit and RB for right bit. During a write, a high voltage (3.5V in this example) is provided to the source/drain region 118 at one end (e.g., LB) of each device being written (i.e., the end being programmed), and the other end (RB) is clamped to ground. Both bias the cell body 102 (SX) and to the gate 106 (G) are set to normal device operating voltages, respectively ground and 1.5V in this example. Most of the drain voltage is seen at the drain diffusion (LB) and in particular across the drain underlap, creating a high electric field there. This high electric field causes electrons in this LB region to gain sufficient energy, becoming so-called hot electrons, to surmount the gate oxide energy barrier and travel to the gate and layered spacer regions. In the course of this hot electron conduction, electrons are trapped in the layered sidewall spacers 116 over the junction underlap and especially in the first nitride spacers 110 where they function as the memory cell stored charge. The other end RB may be similarly written.

The trapped electrons alter the characteristic of the programmed half-cell such that when biased for a read with a low voltage (e.g., 0.1-0.5V and 0.1V in this example) on the previously written terminal LB, the FET channel resistance is substantially higher than it would otherwise be. Thus, contents of each half-cell (i.e., LB=0.1V, RB=0.0V and RB=0.1V, LB=0.0V) may be read by sensing a high or lower device resistance as a 1 or a 0 or vice versa. It should be noted that read and write voltages are provided for example only and are fabrication process dependent, e.g., thickness, dopant, dopant type and material dependent. Thus, fabrication process changes are typically accompanied with corresponding voltage changes.

Similarly, each half-cell may be erased by grounding the gates 106, floating unerased sides, clamping the side being erased to the same high voltage (3.5V) and clamping the channel 102 back bias (SX) to an equally high negative voltage, -3.5V. This reverse biases the source/drain diffusion 118 at the side being erased. This also forces holes into the sidewall spacers 116 that neutralize the previously trapped electrons at the side being erased.

Advantageously, preferred embodiment nonvolatile storage cells can be made using typical FET manufacturing process steps without requiring complicated process changes for a very dense NVRAM cell.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A nonvolatile storage cell comprising:
   a substrate;
   a gate conductor disposed on an upper surface of said substrate, sidewalls of said gate conductor being substantially perpendicular to said upper surface;
   at least one layered spacer formed at one end of said gate conductor along one sidewall of said sidewalls, said layered spacer comprising:
      a first isolating sidewall layer of a first dielectric material at said one Sidewall,
      a charge storage sidewall spacer of nitride at said first isolating sidewall layer, whereby all horizontal layer portions have been removed such that said charge storage sidewall spacer is a vertical nitride sidewall, charge being selectively stored at said charge storage sidewall spacer, said charge storage sidewall spacer consisting of a vertical nitride sidewall, said charge storage sidewall spacer being parallel to said one sidewall,
      a second isolating layer of said first dielectric material at said charge storage sidewall spacer, and
      an outboard nitride sidewall spacer at said second isolating layer; and
   a source/drain diffusion at each end of said gate conductor, each said at least one layered spacer extending over one said source/drain diffusion from said one sidewall at said one end of said gate conductor, said one source/drain diffusion underlapping said gate conductor and said charge storage sidewall spacer.

2. A nonvolatile storage cell as in claim 1, wherein each said layer of said layered spacer is a sidewall spacer.

3. A nonvolatile storage cell as in claim 2, wherein said first dielectric material is oxide.

4. A nonvolatile storage cell as in claim 3, wherein said first isolating sidewall layer is a 3-10 nm thick oxide layer, said charge storage sidewall spacer is a 5-15 nm thick vertical nitride layer, said second isolating layer is oxide, 3-10 nm thick, and said outboard nitride sidewall spacer is a 10-90 nm thick vertical nitride layer.

5. A nonvolatile storage cell as in claim 4, wherein said first isolating sidewall layer is 6 nm thick, said charge storage sidewall spacer is 10 nm thick, said second isolating layer is 3 nm thick, and said outboard nitride sidewall spacer is 70 nm thick.

6. A nonvolatile storage cell as in claim 2, wherein each said one source/drain diffusion underlaps said gate conductor to an outer edge of said charge storage sidewall spacer.

7. A nonvolatile storage cell as in claim 2, wherein said at least one layered spacer is a pair of layered spacers at opposite ends of said gate conductor, both source/drain diffusion at said gate conductor underlapping said gate conductor.

8. A nonvolatile storage cell as in claim 7, wherein said nonvolatile storage cell stores two bits at said opposite ends.

9. A nonvolatile storage cell as in claim 8 wherein said nonvolatile storage cell is one of a plurality of cells in a nonvolatile storage array.

10. An integrated circuit (IC) chip on a silicon substrate layer, said IC including nonvolatile storage cells, each of said nonvolatile storage cells comprising:

a gate disposed on a gate dielectric on an upper silicon substrate surface;

a layered sidewall spacer at each sidewall of said gate, said layered sidewall spacer comprising:

a first isolating sidewall layer of a first dielectric material at said one sidewall of said gate, a charge storage sidewall spacer of nitride at said first isolating layer, whereby all horizontal layer portions have been removed such that said charge storage sidewall spacer is a vertical nitride sidewall, charge being selectively stored at said charge storage sidewall spacer, said charge storage sidewall spacer consisting of a vertical nitride sidewall, said charge storage sidewall spacer being parallel to said one sidewall, a second isolating layer of said first dielectric material at said charge storage sidewall spacer, and an outboard nitride sidewall spacer at said second isolating layer; and a source/drain diffusion disposed at either end of said gate and underlapping said gate, each said layered sidewall spacer being horizontally disposed above an underlap region, said underlap region extending under said charge storage sidewall spacer to said one source/drain diffusion.

11. An IC as in claim 10, wherein said first dielectric material is oxide.

12. An IC as in claim 11, wherein said first isolating sidewall layer is a 3-10 nm thick oxide layer, said charge storage sidewall spacer is a 5-15 nm thick nitride layer, said second isolating layer is oxide, 3-10 nm thick, and said outer nitride sidewall spacer is a 10-90 nm thick nitride layer.

13. An IC as in claim 12, wherein said first isolating sidewall layer is 6 nm thick, said charge storage sidewall spacer is 10 nm thick, said second isolating layer is 3 nm thick, and said outboard nitride sidewall spacer is 70 nm thick.

14. An IC as in claim 11, wherein said charge storage sidewall spacer and said outboard nitride sidewall spacer are disposed above a surface oxide on said silicon substrate layer.

15. An IC as in claim 14, wherein ones of said nonvolatile storage cells store two bits, one bit being stored at each said either end.

16. An IC as in claim 15, further comprising an array of nonvolatile memory cells, said nonvolatile memory cells being ones of said nonvolatile storage cells.

* * * * *